(12) United States Patent
Epmeier et al.

(10) Patent No.: US 10,999,936 B2
(45) Date of Patent: May 4, 2021

(54) METHOD FOR APPLYING ELECTRONIC COMPONENTS

(71) Applicant: Lumileds Holding B.V., Schiphol (NL)

(72) Inventors: Matthias Epmeier, Aachen (DE); Petra Wellmeier, Aachen (DE); Frank Giese, Aachen (DE); Carsten Weber, Jülich (DE); Michael Deckers, Jülich (DE); Georg Henninger, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/563,527

(22) Filed: Sep. 6, 2019

(65) Prior Publication Data

US 2020/0084893 A1 Mar. 12, 2020

(30) Foreign Application Priority Data

Sep. 7, 2018 (EP) .................... 18193210

(51) Int. Cl.
*H05K 3/12* (2006.01)
*H05K 3/32* (2006.01)
*H05K 3/34* (2006.01)

(52) U.S. Cl.
CPC .......... *H05K 3/1225* (2013.01); *H05K 3/321* (2013.01); *H05K 3/341* (2013.01); *H05K 3/3478* (2013.01)

(58) Field of Classification Search
CPC .... H05K 3/1125; H05K 3/321; H05K 3/3478; H05K 3/341
See application file for complete search history.

(56) References Cited

U.S. PATENT DOCUMENTS

| | | | | |
|---|---|---|---|---|
| 5,797,673 A | * | 8/1998 | Logan | G09F 13/04 362/20 |
| 6,567,010 B1 | * | 5/2003 | Lin | G08G 1/095 340/815.45 |
| 7,156,017 B1 | * | 1/2007 | Ingraselino | B41M 1/12 101/115 |
| 2004/0111875 A1 | * | 6/2004 | Hogerl | H01L 21/67144 29/742 |

(Continued)

FOREIGN PATENT DOCUMENTS

| | | |
|---|---|---|
| JP | 63-001318 U | 1/1988 |
| JP | 04-123575 U | 11/1992 |

(Continued)

*Primary Examiner* — David H Banh
(74) *Attorney, Agent, or Firm* — Volpe Koenig

(57) ABSTRACT

A method for applying at least one electronic component to a surface is described. The method includes placing a component stencil on a support. At least one electronic component is arranged in a corresponding opening of the component stencil with a top surface of the electronic component on the support. A contact material stencil is positioned on the component stencil such that at least one opening in the contact material stencil is over a corresponding contact region on the bottom surface of the at least one electronic component. A contact material is applied on the at least one contact region of the at least one electronic component within the corresponding opening of the contact material stencil. The contact material stencil is removed from the component stencil. The component stencil is removed from the support. The at least one electronic component is applied to the surface.

20 Claims, 5 Drawing Sheets

(56) References Cited

U.S. PATENT DOCUMENTS

Figure 1A:
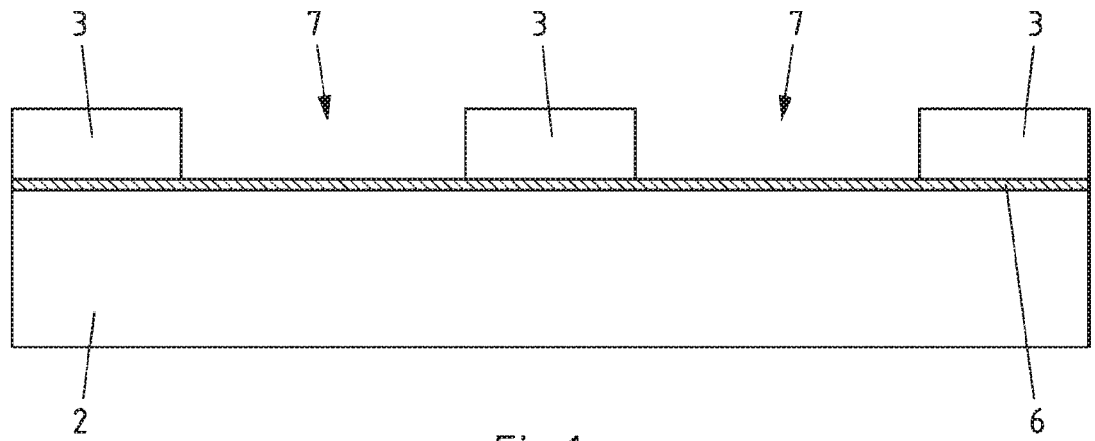

| | | | |
|---|---|---|---|
| 2009/0174301 A1 | 7/2009 | Frey et al. | |
| 2010/0132189 A1* | 6/2010 | Nakashima | H05K 13/0417 29/832 |
| 2011/0169033 A1* | 7/2011 | Fukunaga | H01L 33/52 257/98 |
| 2013/0170936 A1* | 7/2013 | Tan | B25J 15/0616 414/752.1 |
| 2016/0044798 A1 | 2/2016 | Kawata et al. | |
| 2016/0148472 A1* | 5/2016 | Hsu | G08B 5/36 362/231 |
| 2019/0023059 A1* | 1/2019 | McBride, Jr. | B43L 13/205 |
| 2020/0084893 A1* | 3/2020 | Epmeier | H05K 3/3478 |

FOREIGN PATENT DOCUMENTS

| | | |
|---|---|---|
| WO | 2014/199439 A1 | 12/2014 |
| WO | 2014/203718 A1 | 12/2014 |

\* cited by examiner

METHOD FOR APPLYING ELECTRONIC COMPONENTS

FIELD OF INVENTION

The present disclosure relates to a method for applying at least one electronic component to a surface, in particular inside or onto complex surfaces of 3D-shaped objects.

BACKGROUND

In industry, the surface-mount technology (SMT) for producing electronic devices has largely replaced the through-hole technology (tht) construction method of fitting components with wire leads into holes of a printed circuit board (PCB). In the SMT-method, electronic components such as light-emitting elements, e.g. light-emitting diodes (LEDs), are conventionally mounted on substantially flat or 2D-shaped PCBs by reflow soldering.

However, nowadays, attempts are made to mount electronic components to rather complex surfaces such as inside objects or onto surfaces of non-flat or 3D-shaped objects. In particular, recently, there have been efforts to replace traditional light sources such as incandescent light sources comprising a wire filament by lighting devices comprising light-emitting elements such as LEDs. For some specific applications, for instance in automobile lighting, it is desirable to perform a "retrofitting" of such lighting devices. For example, it is advantageous if only the traditional light source such as an incandescent light bulb is replaced by a LED lighting device, while the remaining elements of the lamps, e.g. optical elements such as reflector cups and lenses, do not require replacement.

Configuring lighting devices for retrofitting traditional light sources is however challenging. As the lighting device is intended to make use of the same optical elements as a traditional light source, the illumination pattern of the traditional light source has to be mimicked closely by the arrangement and specification of the light-emitting elements. For example, it may be required arranging LEDs in a manner representing the shape of a filament of an incandescent light source, with multiple LEDs being arranged along an arrangement direction close to each other. Therefore, mounting of LEDs in particular to complex shaped objects such as for retrofitting applications needs to be performed particularly precisely.

By employing SMT, the production process may be increased, but the risk of defects also increases due to component miniaturization and denser packing of electronic components on a surface. Especially, the reliability of solder joints due to inadequate amounts of solder becomes more of a concern. If on the one hand the applied solder amount is too high, the solder melted by the reflow leaks outside of the contact region of the electronic component and warping of the electronic component and the surface at the time of reflow will result in soldering failure causing a drop in yield of the electronic devices. Also, the Tombstone Effect may occur. On the other hand, if the amount of solder between the electrodes is too small, the presence of voids can deteriorate the joint strength and eventually lead to joint failure.

SUMMARY

Conventional methods for applying electronic components to a surface may have insufficient accuracy in the application of electronic components. In particular, the attachment to surfaces of complex structures still requires optimization, as solder patterns are located imprecisely or have an inadequate amount of solder.

It is therefore an object of the present invention to provide a method for reliably applying electronic components to a surface, in particular to complex surfaces of 3D-shaped objects. Particularly, the above-mentioned disadvantages of the prior art shall be avoided and a method for reducing production costs, for avoiding solder smearing and for increasing solder-location accuracy and reproducibility shall be provided. The invention further relates to a system that enables the method to be carried out efficiently and reproducibly. The invention further relates to an electronic device, in particular a lighting device for improving an illumination pattern, in particular for retrofitting applications.

According to a first aspect of the present invention, a method for applying at least one electronic component to a surface is suggested, the method comprising: placing a component stencil on a support, wherein the component stencil comprises at least one opening corresponding to an electronic component; arranging at least one electronic component in the corresponding opening of the component stencil; positioning a contact material stencil on the component stencil, wherein the contact material stencil comprises at least one opening corresponding to at least one contact region of the at least one electronic component; applying a contact material on the at least one contact region of the at least one electronic component arranged in the corresponding opening of the contact material stencil; and applying the at least one electronic component to the surface, wherein the contact material connects the at least one electronic component to the surface.

According to a second aspect of the present invention, a system for use in the method for applying at least one electronic component to a surface is suggested, the system comprising: a support, which is optionally capable of conforming to a surface on which at least one electronic component is to be applied; a component stencil, wherein the component stencil comprises at least one opening corresponding to at least one electronic component; a contact material stencil, wherein the contact material stencil comprises at least one opening corresponding to at least one contact region of the at least one electronic component.

According to a third aspect of the present invention, an electronic device is suggested, the electronic device comprising: a surface of a carrier and at least one electronic component arranged on the surface, wherein the at least one electronic component is arranged on the surface by the method for applying at least one electronic component to a surface.

Exemplary embodiments of the first, second, and third aspect of the invention may have one or more of the properties described below.

The above-described method is advantageous for applying at least one electronic component on a surface as compared to conventional SMT methods, because accuracy and reproducibility of contact material application can be ensured. As the surface may have a complex shape and may in particular be arranged in a three-dimensional (non-flat) manner, a reliable positioning of contact material on the surface, such as solder may not be possible by means of standard techniques such as solder masks, for instance. Solder masks may be particularly difficult to apply to complex shaped and comparably small surfaces. Further, when solder is disposed near the edge of a mounting face of a surface, the positioning and the amount of solder is hard to control. Especially during reflow of the solder, an undesired repositioning of electronic components may therefore occur.

It has been found that it is advantageous to apply contact material such as solder paste on the at least one electronic component, in particular on contact regions of the at least one electronic component.

The at least one electronic component may for instance be removably fixed on the support, wherein in particular the at least one electronic component is applied to the surface while the at least one electronic component is removably fixed on the support. The support may be used for a precise positioning and application of the at least one electronic component. For instance, the at least one electronic component is applied to the mounting face(s) of a surface of a carrier, such as a support with a conductor structure (e.g. a printed circuit board/PCB). The contact material may be subjected to reflow and/or curing. The support may be removed before, after or during the reflow and/or curing of the contact material.

Particularly, a plurality of electronic components may be applied at the same time, wherein the number and type of the electronic components are not particularly limited. Also, the form and physical dimension of the at least one electronic component is not limited, however, preferably, the at least one electronic component has the form and physical dimensions appropriate for a surface-mount manufacturing method. It may be an electronic component of a very small size and generally of a compact rectangular or square shape in particular, such as LEDs, capacitors, resistors, etc. As described above, the at least one electronic component may further comprise contact regions, e.g. at least one pair of electrodes formed on a surface of the electronic component, preferably at least one pair of pads, more preferably at least one anode pad and at least one cathode pad.

The at least one electronic component may be applied precisely to substantially flat or 2D-shaped surfaces of a carrier such as a PCB. The term "carrier" may be understood to comprise any suitable material that can be prepared to receive electronic components. Generally, a carrier may have conductive tracks, pads, etc. formed on a non-conductive substrate. Mounting pads may be arranged to receive the at least one electronic component. Advantageously, the at least one electronic component can be applied on 3D-shaped surfaces, in particular inside or onto complex surfaces of 3D-shaped objects, with high location-accuracy and reliable reproducibility.

The support may be capable of conforming to a surface on which the at least one electronic component is to be applied. There is no restriction in size or shape of the support. Both, the size and shape of the support preferably correspond to the size and shape of the surface the at least one electronic component is applied to. However, it may also be sufficient, if the size and/or shape of the support and/or of the component and/or the contact material stencil correspond to the size and shape of the surface. The support may consist of a metal, such as aluminum, a plastics material or any other material stable enough for providing a suitable support for application of the stencils and the electronic components and for reliably positioning and keeping the support on the surface during application. The support may also comprise a thermally conducted material to provide a heat dissipation function.

The component stencil is placed on the support. A direct contact between the component stencil and the support is however not required, with other elements being arranged in between support and component stencil. For example, the support may be partially masked to avoid direct contact of the support and component stencil, e.g. when the support is provided with an adhesive layer and adhesion of the component stencil is to be avoided. In other embodiments, the component stencil may also be formed as integral component with the support or formed directly on the support. This may for example be achieved by 3D-machining of the component stencil and/or the support. The size, the shape and the thickness of the component stencil can vary depending upon the application in which it is to be used. However, the size and the shape of the component stencil preferably correspond to the size and/or the shape of the surface the at least one electronic component is supposed to be applied to.

The component stencil defines openings corresponding to the at least one electronic component, e.g. in size and/or shape. Therefore, the at least one electronic component can be arranged in the corresponding opening of the component stencil and for instance be kept in place by the side walls of the opening. In some embodiments, a direct contact between the at least one electronic component and the side wall(s) may be provided, while in other embodiments the at least one electronic component and the side wall(s) may be spaced apart, wherein for example the opening provides a guide for centering the at least one electronic component.

The arrangement of the openings further may correspond to a negative of the locations on the surface the electronic components are supposed to be applied to. The component stencil can have a variety of different configurations and opening patterns depending on what is necessary for a particular operation and the present invention is not limited to any particular stencil configuration or opening pattern.

The component stencil may be formed by machining, laser etching, and/or chemical etching a sheet of metal, such as stainless steel and/or aluminum, for example, before the component stencil is placed on the support. The component stencil may be alternatively formed by photolithography or any other means for applying the predetermined pattern. Furthermore, the stencil may also be made of any suitable flexible material. In an embodiment of the invention, the stencil is constructed of a flexible polymer material. One example of a suitable material for the component stencil is polyimide sold by DuPont under the tradename Kapton®. In various embodiments, the component stencil may be reusable, thus providing cost savings.

The size and shape of the contact material stencil preferably corresponds to the size and/or shape of the component stencil and optionally of the support. The contact material stencil comprises openings corresponding to size and/or shape of the at least one contact region of the at least one electronic component. The at least one contact region may comprise pads, which may be preferably formed of various electrically conductive materials. The electrical component for example comprises a set of at least two electrical contact pads at a base surface which may extend over at least part of the width or most of the width of the base surface and may be separated by a suitable gap.

The positioning of the contact material stencil on the component stencil is performed such that the at least one opening of the contact material stencil is aligned with the at least one contact region of the at least one electronic component. The contact material stencil may comprise the same material as the component stencil and/or the support. However, the material may also be different from the material of the component stencil and/or the support. Naturally, also a flexible material can be used.

Applying of the contact material onto the at least one contact region of the at least one electronic component is performed by using the contact material stencil. The contact material may be applied through the openings of the contact material stencil to provide contact material deposits on the contact regions. For example, a precision squeegee drives the contact material through the openings of the contact material stencil onto the surfaces of the contact regions of the electrical component in one pass. In an embodiment, the contact material may be applied by spreading the contact material from a source over the top surface of the contact material stencil using a squeegee. The squeegee may be manipulated manually or may automatically.

The extent of the contact material may be strictly limited to the size and/or shape of the contact regions by the side walls of the openings of the contact material stencil corresponding to size and shape of the contact regions. Therefore, location accuracy of the contact material can be ensured.

By means of the contact material, the at least one electronic component can be connected to the surface of the carrier. Preferably, an electrical connection between the at least one contact region of the electronic component and the at least one contact region of the carrier is established. The electrical contact may for example be established by means of soldering, in particular by using solder paste (optionally with flux) and/or by using conductive adhesive.

With the above-described method, an extremely precise and reliable placement of the electronic components even on surfaces of complex 3D-shaped carriers can be ensured. Also, the application of an accurate amount of contact material can be ensured and therefore the described disadvantages of the prior art can be effectively avoided.

According to a first embodiment of the present invention, applying the at least one electronic component to the surface is at least partially performed by an SMT component placement system. For example, the at least one electronic component may be placed on a surface of a carrier using an automated pick-and-place machine. Such pick-and-place equipment may have multiple robotic heads for applying components or a group of electronic components simultaneously at various locations of the carrier surface, improving throughput as well as location-accuracy as the electronic component mounting process can be managed automatically with high precision.

For instance, the at least one electronic component may be applied to the surface of a carrier in a two-way-process. For example, automatic tweezers may be used to individually grab and remove a single electronic component from the support and to hand it over to a holding device, such as a vacuum nozzle. The holding device may then apply the single electronic component to the surface of the carrier. This two-way-process may also be performed by multiple tweezers and multiple holding devices, respectively, at the same time. Besides using a pick-and-place machine as the at least one holding device, also tweezers such as vacuum tweezers, a vacuum pen or other tools can be used for arranging and/or applying the at least one electronic component.

According to an embodiment of the present invention, the at least one electronic component is removably fixed on the support. By removably fixing the at least one electronic component to the support, e.g. magnetically, by non-permanent adhesive, by gluing, by mechanical coupling or any other kind of detachable connection, the at least one electronic component can be held in position on the support until it is applied to the surface. The support may be removed before, after or during the reflow and/or curing of the contact material.

Also, the component stencil may optionally be removably secured to the support to avoid slipping or warping of the component stencil and to provide exact alignment with the support.

According to another embodiment of the present invention, applying the at least one electronic component fixed on the support to the surface comprises bending the support to conform the shape of the surface, wherein optionally at least one holding device is used for bending the support to conform the shape of the surface and/or to arrange the at least one electronic component fixed on the support on the surface. Bending of the support and optionally of the component and/or the contact material stencil allows flexible use of the system on various shapes of surfaces. Bending the support may in particular be useful to conform the shape of multiple areas of a surface, such that electronic components may be mounted on multiple mounting faces simultaneously. Preferably, the system may be bended around at least two, more preferably around three linear independent axes. For example, forms and shapes of objects can be adopted flexibly. Thus, the electronic components cannot only be applied to surfaces of 2D-shaped carriers, but also to surfaces of various 3D-shaped objects in a single application step. The support (and optionally the stencils) may comprise a flexible material such as polyimides and/or silicone for example. The flexible material may also help the support and/or the stencil to conform to any surface irregularities.

The support may be picked up by one or more holding devices such as suction nozzles. For instance, for each electronic component or groups of electronic components (e.g. for each group corresponding to a mounting face or area of a surface), a holding device may be used. The holding devices may be positioned and rotated in respect to each other for flexibly adjusting the shape of the support or the system, in particular to obtain a shape of the support and optionally of the component and/or contact material stencil that corresponds to the shape of the surface of the carrier, and for applying the electronic components to the surface.

For example, a base material may be used (e.g. a board material such as an aluminium sheet, a PCB blank, etc.) on which the support is disposed when the at least one electronic component is arranged on the support. The base material may contribute to a handling of the support and the at least one electronic component by the SMT component placement system.

In some embodiments, the support, the component stencil and/or the contact material stencil, further optionally a base material may comprise marking elements that allow for an alignment of the corresponding elements in respect to each other.

According to a another embodiment of the present invention, the support has at least one predetermined bend line, in particular of a material weakening such as a material reduction or a perforation. The bend line may for instance correspond to lines separating sections of the support, wherein each section corresponds to an electronic component or a group of electronic components, e.g. corresponding to a mounting face of a surface. By means of bend lines, the precision of the bending of the support and therefore the precision of the positioning of the electronic components can be significantly improved. Bend lines may for instance be formed by a material weakening such as perforations in the support. Other configurations may also be possible in addition or as alternative, such as a material reduction and/or a different material with higher flexibility than the remainder of the support.

According to another embodiment of the present invention, the contact material is capable of providing electrical contact and in particular comprises solder paste and/or a conductive adhesive, wherein applying the at least one electronic component to the surface comprises establishing an electrical contact of the at least one electronic component to the surface. For establishing an electrical contact of the at least one electronic component to the surface, contact material may also be applied to corresponding contact regions on the carrier surface. Preferably, the application of contact material on the carrier surface may be applied by conventional solder printing methods using at least one solder mask corresponding to the surface of the carrier. The electronic component(s) removably fixed to the support may then be placed onto the surface with their contact regions aligned to the contact regions of the carrier surface.

The contact material may comprise solder paste which may be a mixture of solder (e.g. an alloy of tin and lead or tin, silver and copper) and has a sticky consistency. The pliability of the solder paste results in each of the openings being substantially filled with the solder paste to form solder paste deposits. In an embodiment, a solder paste inspection (SPI) may be performed after removal of the contact material and/or component stencil. The SPI may include applying light to the solder paste deposits and analysing the reflection of the light to identify defects, to check for alignment of the solder paste deposits on the contact regions, and the like. Alternatively or in addition, for example, conductive adhesive or flux may be used as contact material.

Using solder paste as contact material, preferably solder reflow is performed to establish the electrical contact by forming solder joints between the at least electrical component and the corresponding contact region of the surface. The contact material deposits, e.g. solder paste deposits with or without flux may be reflowed to form corresponding solder joints between the at least one electrical component and the pads on the surface of the carrier. Reflowing the deposits may include temporarily applying heat to the structure, including the carrier, the pads, the deposits and the at least one electrical component, for example, causing the contact material deposits to melt. For example, the structure may be heated by placing it in a heated environment, such as a reflow oven. The heated environment may contain an excess of nitrogen to enable better wetting characteristics of the solder deposits, and to prevent oxidation of solder deposits at high temperatures. When the solder paste deposits are in the melted or molten state, they become substantially rounded (effectively forming a half circle or half ellipse). A heat cycle with a predefined time sequence of temperatures according to the type of contact material may be performed. The heat is then removed so that the contact material solidifies into e.g. solder joints, attaching the at least one electrical component to the surface pads. Significantly the tacky textures of the deposits hold the at least one electrical component substantially in place during the reflow process, so that the at least one electrical component effectively does not change position and/or orientation, as a practical matter. The formation of the contact material joints ends the process of the method of applying the electrical components to pads on the surface. In an embodiment, flux cleaning may be performed after reflow of the deposits in order to remove excess or residual contact material from the carrier.

To allow the at least one electrical component and optionally the component stencil to be removably secured to the support, an adhesive may be provided on the support for removably fixing the at least one electronic component to the support. In particular, the upper side of the support may be coated with an adhesive. The adhesive may in some embodiments be a high temperature, permanent or semi-permanent adhesive that will ensure that the components and the stencil will stay adhered to the support for a prolonged period of time even at elevated temperatures. Optionally, the adhesive may be formulated such that the at least one electronic component and/or the component stencil may be re-applied and re-aligned several times until it is placed correctly if required. In some embodiments, the support and in particular the adhesive may be heat resistant in that the support is capable to resist temperatures required for performing the curing/reflow of the contact material. The support may then remain on the electronic element(s) while curing/reflow and be removed afterwards.

According to a further embodiment of the present invention, the adhesive is curable, in particular UV-curable. Preferably, a UV tape is applied to the support prior to placing the component stencil on the support and prior to arranging the at least one electronic component in the corresponding opening of the component stencil. In UV tapes, the adhesive bond is broken by exposure to UV light, allowing the adhesive to be strong during adhering components while still allowing clean and easy removal. The higher the power the more complete the cure and the lower adhesion and the less adhesive residue may be left behind. Thus, the UV-curable adhesive may preferably be UV-cured and removed prior to reflow. A curable adhesive therefore also opens the possibility to use supports that are not heat resistant in that heat required for curing/reflow would damage the support.

UV and light curing adhesives are designed to adhere to a wide range of substrates in demanding applications. Formulated for bonding and coating properties, these adhesives are ideal for applications which require resistance to thermal influence such as soldering temperature. For instance, an unwanted expansion of the UV-curable adhesive is avoided. Another advantage of curing adhesives with ultraviolet light is the speed at which the final product can be readied. In addition to speeding up production, flaws and errors can be reduced as the amount of time that undesired particles such as dust may settle on the support is reduced. This can increase the quality of the finished item and allow for greater consistency.

The support may also comprise polyimides. Polyimides are used in electrical engineering because of their heat resistance, low outgassing, radiation resistance and insulating properties. High continuous operating temperatures of up to 230° C. and for a short time up to 400° C. are possible. Due to its large range of temperature stability and its electrical isolation ability, Kapton® tape is usually used in electronic manufacturing as an insulation and protection layer for electrostatic sensitive and fragile components. As it may be able to sustain the temperature needed for a variety of reflow soldering operations, the properties of the support may be available throughout the whole production process. Thus, using Kapton® tape, the at least one electrical component is preferably reflowed prior to removing the tape.

Further, prior to applying the at least one electronic component to the surface, the contact material stencil may be removed from the component stencil and, optionally, the component stencil may be removed from the support. The contact material filled into the openings of the contact material stencil covers the contact regions of the at least one electronic component, wherein excessive contact material may be skimmed from the contact material stencil. Hence, the contact material is flush with the surface of the contact material stencil and, in case the at least one electronic component is applied with the help of the support, the alignment of the contact material deposits on the electronic component with corresponding contact regions on the surface of a carrier would be difficult with a remaining contact material stencil. In particular, the remaining contact material stencil could cause problems such as irregularities in solder reflowing and thus imprecise application of the electronic component.

Besides, in case the at least one electronic component is applied individually without the support, for example in the two-way-process as described above, the remaining contact material stencil may hinder the automated tweezers to grab the at least one electronic component.

Optionally, the component stencil can also be removed from the support prior to application of the at least one electronic component. However, in some embodiments the component stencil may also be left on the support, e.g. in case the at least one electronic component is applied with the help of the support during application for laterally stabilizing and holding the electric component in position during application, thus ensuring a precise placement.

According to a preferred embodiment of the present invention, the surface comprises at least two mounting faces being arranged adjacent to each other and/or being arranged at an angle to each other, wherein in particular multiple electronic components are arranged along an arrangement direction of at least one of the at least two mounting surfaces. For instance, the mounting faces of a 3D-shaped object may be at least partially flat or planar to provide an area suitable to accommodate an electrical component. The mounting faces each have an arrangement direction and are configured for accommodating at least one electrical component arranged along the arrangement direction. The arrangement direction may correspond to an extension direction of the corresponding mounting face and/or the at least one electrical component. For instance, the arrangement direction may correspond to a longest dimension of the mounting face and/or the at least one electrical component. The mounting faces may in particular be configured such that multiple electrical components may be arranged along a line, e.g. a straight line, wherein the arrangement direction corresponds to the orientation of the line of electrical components.

By using multiple mounting faces and light-emitting elements as electrical components, the illumination provided by a filament can be mimicked with higher precision. For instance, the arrangement direction of each mounting face may be substantially parallel to each other, wherein the mounting faces represent different sides of the filament. In particular, at least two mounting faces are arranged adjacent to each other, such that a continuous area for mounting light-emitting elements is obtained. At least two mounting faces may be arranged substantially parallel to each other, for example, to obtain several areas of illumination towards the same direction and in particular for mimicking light sources with multiple filaments. At least two mounting faces and in particular adjacent mounting faces may be arranged at an angle to each other. For instance, the mounting faces arranged at an angle to each other may represent different sides of a filament and/or provide an increased angle of illumination.

According to another embodiment of the present invention, the surface comprises three mounting faces, one of the three mounting faces being arranged between the other two mounting surfaces and in particular being arranged substantially perpendicular to the other two mounting surfaces.

Further, one of the three mounting faces may be arranged between the other two mounting surfaces and may optionally be arranged directly adjacent to the other two mounting faces. The mounting section may for example comprise four sides, with three sides providing the mounting faces and the fourth side providing contact to the body section.

The at least one electronic component may in particular comprise a light-emitting diode (LED). LEDs may comprise at least one semiconductor element such as a p-n-junction, a diode, and/or a transistor. For instance, the LEDs may be provided in form of separate or combined LED dies and/or LED packages, wherein particular at least one LED may be arranged on a substrate, e.g. a sapphire substrate. An LED package may comprise a wavelength conversion element (e.g. based on phosphor) and/or may comprise at least one optical element such as a diffusing layer, a diffractive element (e.g. a lens) and/or a reflective element (e.g. a reflector cup). The LED or LEDs may for instance be integrated into an LED lead frame.

The features and example embodiments of the invention described above may equally pertain to the different aspects according to the present invention. In particular, with the disclosure of features relating to the method according to the first aspect, also corresponding features relating to the system and electronic device according to the second and third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Figure 2A:
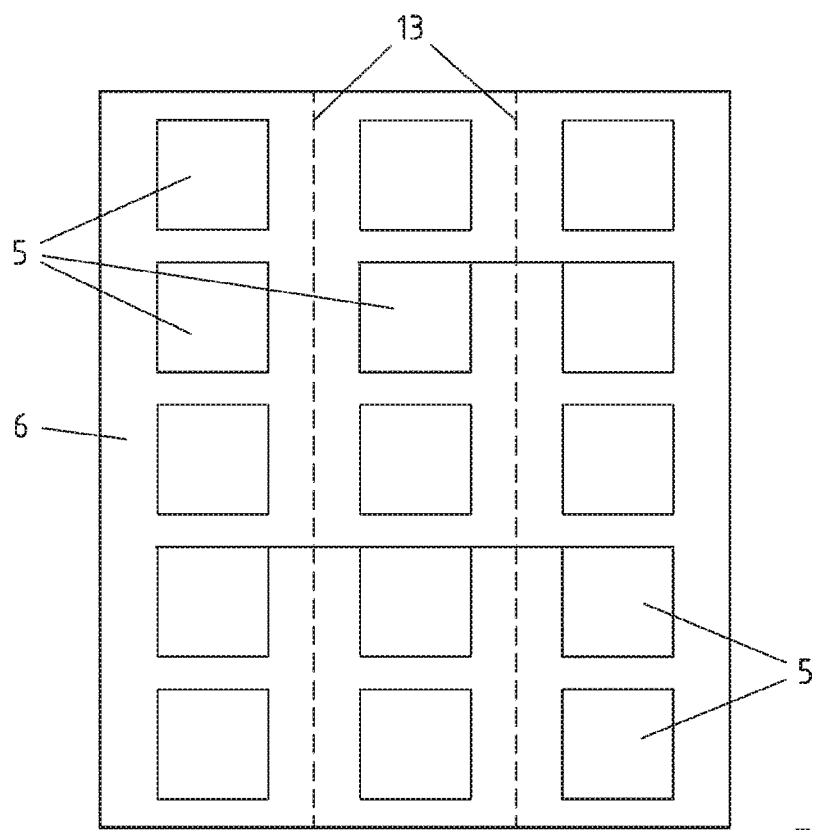
Figure 2B:
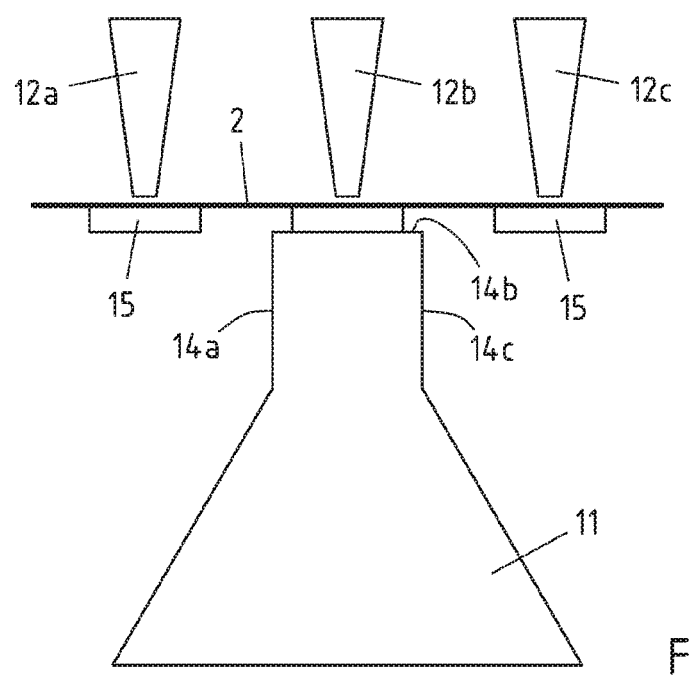
Figure 2C:
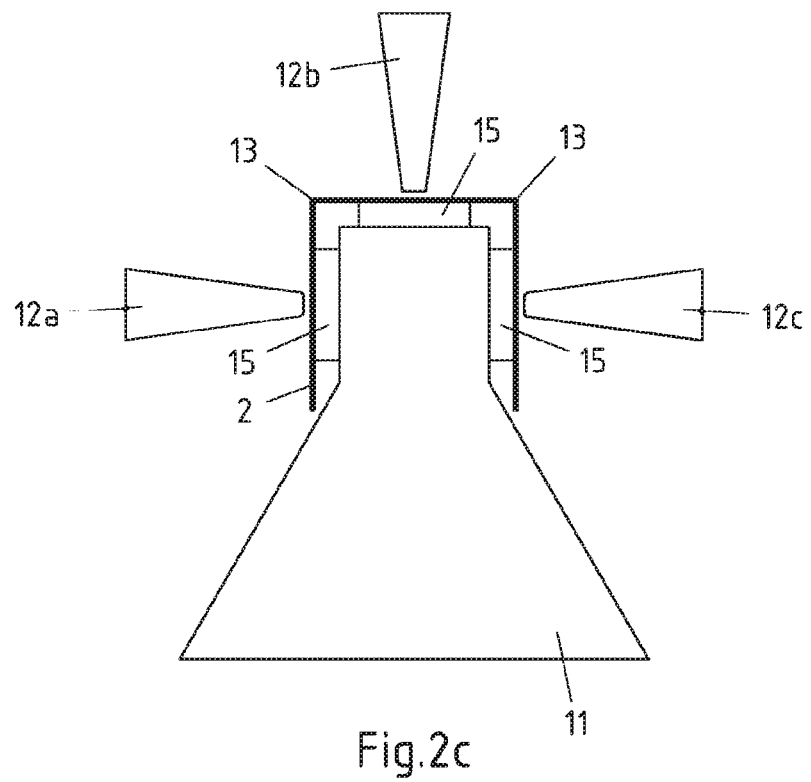
Figure 2D:
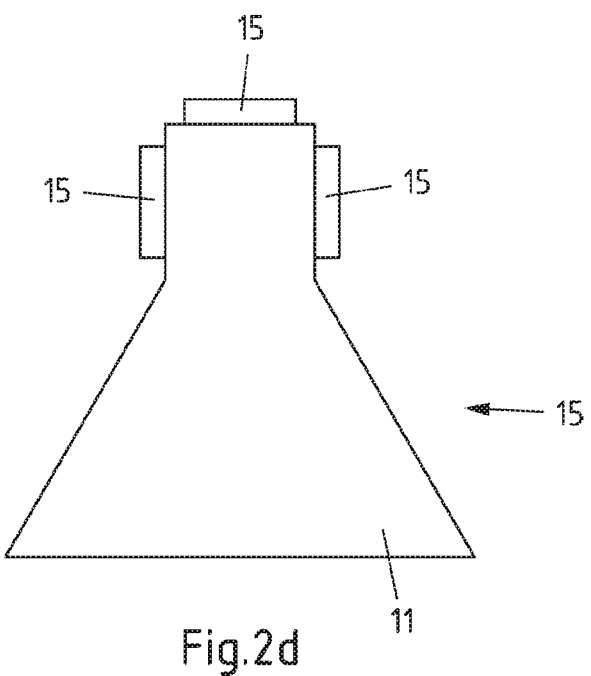
Figure 3A:
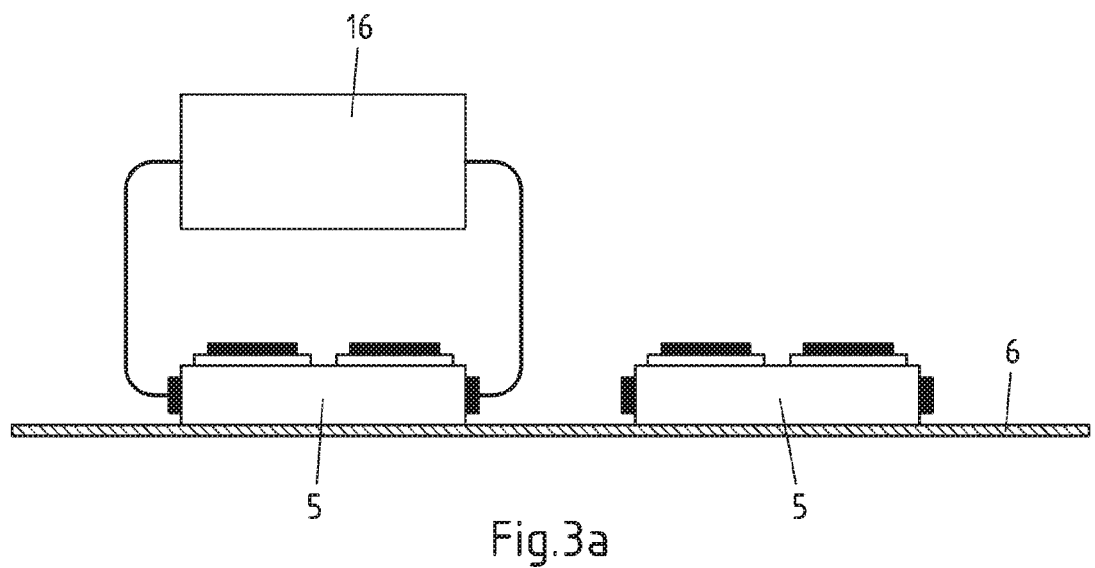
Figure 3B:
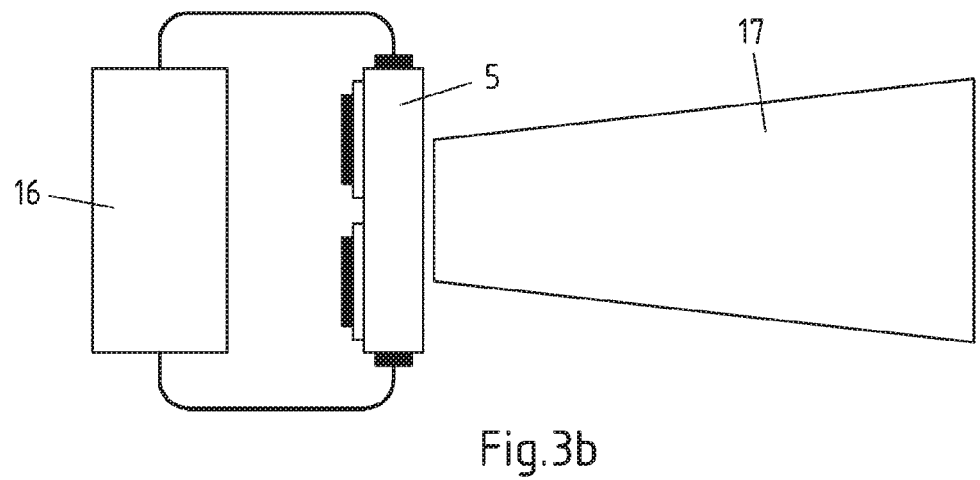
Figure 3C:
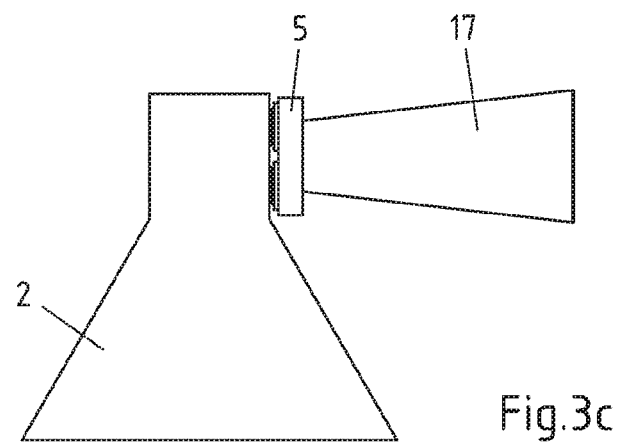

Examples of the invention will now be described in detail with reference to the accompanying drawing, in which:

FIG. 1*a-e* show schematic representations of a first exemplary embodiment of the method in a side view;

FIG. 2*a-d* show schematic representations of an embodiment of a method for producing an electronic device; and FIG. 3*a-c* show schematic representations of a further embodiment of a method for producing an electronic device.

DETAILED DESCRIPTION OF THE PREFERRED EMBODIMENT(S)

FIG. 1*a-e* show a schematic representation of an exemplary embodiment of the inventive method in a side view. In FIG. 1*a*, a base material 2 is provided, which may consist of a metallic material, a plastics material, a resin, or any other material stable enough for providing a suitable carrier for application of stencils and electronic components.

A support 6 disposed on the base material 2 and may be made of a flexible material to be capable of conforming to a surface, in particular a surface of a 3D-shaped object. The support 6 may comprise an adhesive layer (not shown), for instance in that the support 6 is an adhesive polyimide tape or an UV curable adhesive tape.

A component stencil 3 is placed on the support 6. Optional the component stencil 3 may be removably attached to the support 6 due to the adhesive layer. The size and the shape of the component stencil 3 correspond to the size and shape of the support 6. The component stencil 3 further defines openings 7 corresponding to electronic components in size and shape. As will become more apparent, the openings 7 are positioned in respect to each other corresponding to positions of the corresponding electronic components on a surface on which the components are to be mounted.

Figure 1B:
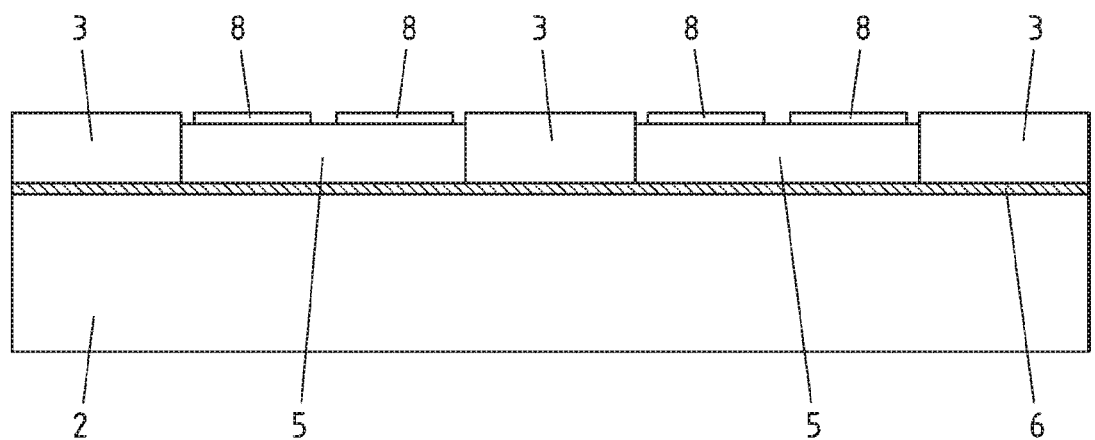

As shown in FIG. 1b, electronic components 5 are provided, which in the exemplary embodiment comprise separate light-emitting elements (e.g. LEDs), each comprising two contact regions 8 on the bottom surface of the respective light-emitting element. The top surface of each electronic component 5 is removably adhered to the support 6. Additionally, the electronic components 5 are hold and precisely kept in position by contact to the side walls of the corresponding opening 7 of the component stencil 3.

Figure 1C:
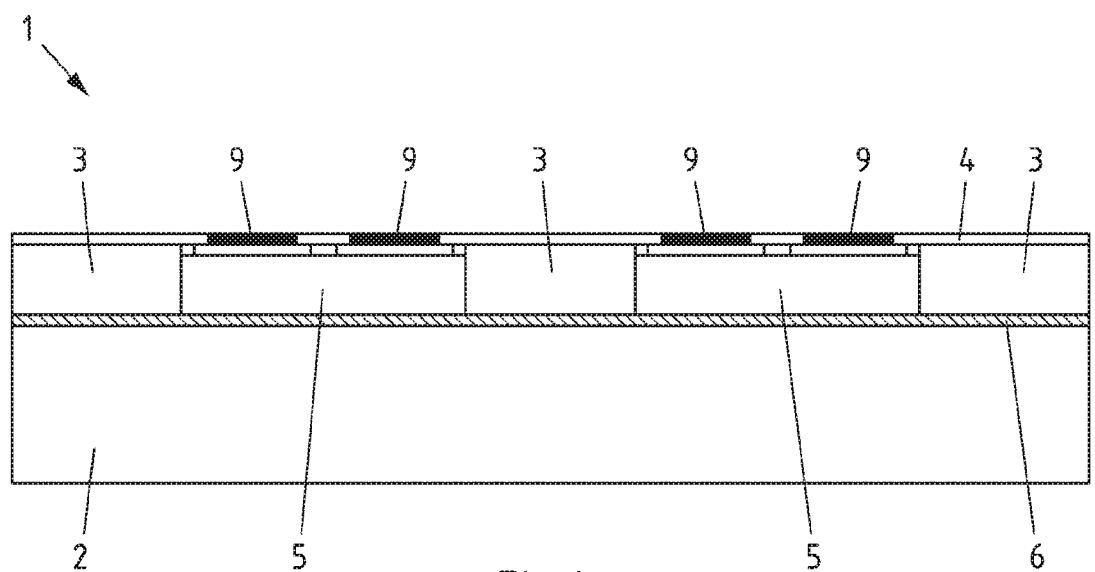

The positioning of the contact material stencil 4 as shown in FIG. 1c on the component stencil 3 is performed such that the openings of the contact material stencil 4 are aligned with the contact regions 8 of the light-emitting elements 5. For instance, the component stencil 3 and the contact material stencil 4 may comprise marker elements to facilitate alignment. The openings of the contact material stencil 4 are smaller in size of the contact regions 8 of the light-emitting elements, but may also correspond to the size and shape of the contact regions 8 of the electronic components 5. The support 6, the component stencil 3 and the contact material stencil 4 may form a system 1 according to the invention.

Figure 1D:
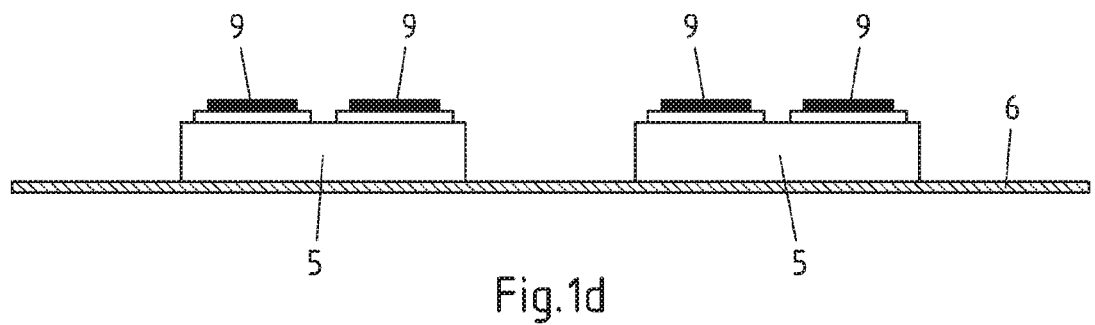
Figure 1E:
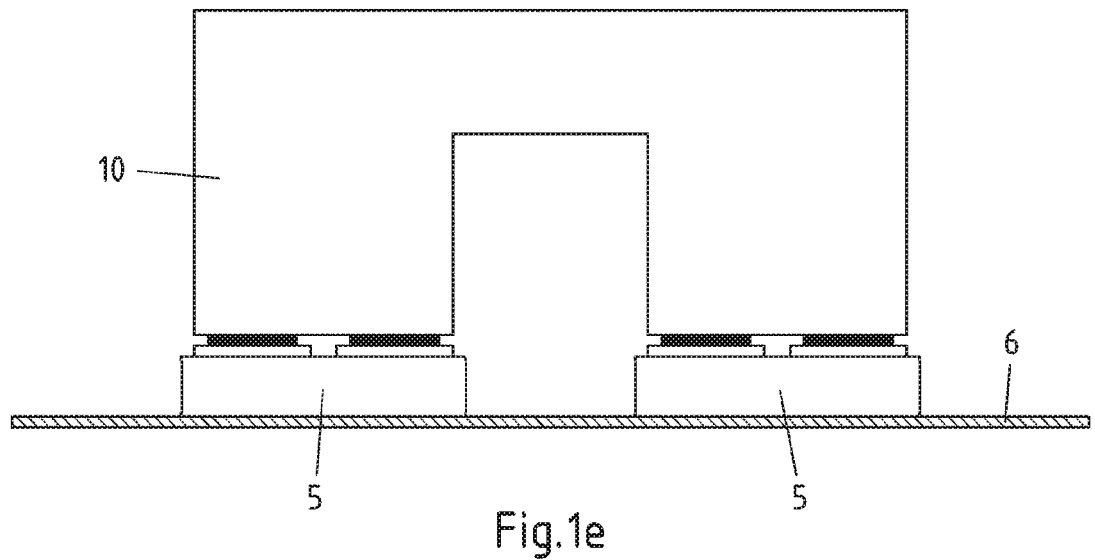

A contact material 9 is applied through the openings of the contact material stencil 4 to provide corresponding contact material deposits, such as solder deposits 9, on the contact regions 8. Prior to applying the electronic components 5 removably fixed on the support 6 to a surface, the contact material stencil 4 is removed from the component stencil 3 and the component stencil 3 is removed from the support 6. As depicted in FIG. 1d, the solder deposits 9 remain on the contact regions 8 of the electronic components 5 and may serve to establish an electrical contact to corresponding contact regions of the surface of a carrier. As the electronic components 5 are removably fixed on the support 6, the support 6 may be picked up from the base material 2 and used for mounting of the electronic components 5. Due to the arrangement of the light-emitting elements 5 and the solder deposits 9 by means of the component stencil 3 and contact material stencil 4, respectively, the light-emitting elements may be positioned accurately on a surface of a carrier 10 while the position and amount of contact material may be precisely controlled, as shown in FIG. 1e. In particular, the solder deposits 9 may be positioned near edges formed in the surface of the carrier 10.

FIG. 2a-d show schematic illustrations of a method for producing an electronic device according to the invention. Electronic components 5 configured as light-emitting elements are mounted on a surface of a 3D-shaped carrier 11. FIG. 2a represents a front view of a support 6, wherein the light emitting elements 5 are removably fixed on the support 6, which is for instance formed by an adhesive polyimide tape or an UV curable adhesive tape. The support 6 has predetermined bend lines in form of perforations 13 that divide the electronic components 5 into groups, each group corresponding to a mounting face 14a, 14b, 14c of the surface of the 3D-shaped carrier 11. Solder paste as a contact material is applied on contact regions of the electronic components 5 (not shown).

The support 6 is picked up by suction nozzles 12a, 12b, 12c of a holding device (not shown). Three suction nozzles 12a, 12b, 12c or three groups of suction nozzles 12a, 12b, 12c are used, each corresponding to a group of electronic components 5 and a mounting face 14a, 14b, 14c of the surface of the 3D-shaped carrier 11. After the electronic components 5 corresponding to mounting face 14b have been applied, as shown in a top view of the 3D-shaped carrier 11 in FIG. 2b, the suction nozzles 12a, 12c are repositioned and rotated such that the support 6 is bent at the perforations 13 to conform the shape of the mounting faces 14a, 14b, 14c of the surface of the 3D-shaped carrier, as shown in FIG. 2c.

As an alternative, the support 6 may be cut into strips, each strip corresponding to a mounting face 14a, 14b, 14c of the surface of the 3D-shaped carrier (not shown) and the strips being applied in a similar manner.

The solder paste is subjected to a reflow after positioning of the electronic components 5 such that the solder paste permanently connects the electronic components 5 to the mounting faces 14a, 14b, 14c of the surface of the 3D-shaped carrier 11. The support 6 may be removed from the light-emitting elements 15 after reflow (e.g. when adhesive polyimide tape is used) or before reflow (e.g. when using UV curable adhesive tape that can be exposed to UV light to reduce adhesion to the electronic components 5). A light-emitting device 15 is obtained as shown in FIG. 2d.

Applying the at least one electronic component 5 to the surface may also be performed by means of an SMT component placement system. As shown in FIGS. 3a and 3b, automatic tweezers 16 individually grab and remove a single electronic component 5 from the support 6 and hand it over to a holding device 17, such as a vacuum nozzle. Application of the single electronic component 5 to the surface of the carrier 11 is performed by means of the holding device 17 as shown in FIG. 3c.

What is claimed is:

1. A method for applying at least one electronic component to a non-planar surface of an object, the method comprising:
   placing a component stencil on a support;
   arranging a plurality of electronic components in a plurality of corresponding openings of the component stencil with a top surface of the plurality of electronic components on the support;
   positioning a contact material stencil on the component stencil such that each of the plurality of openings in the contact material stencil is over a corresponding contact region on the bottom surface of each of the plurality of electronic components;
   applying a contact material on the at least one contact region of each of the plurality of electronic components within the corresponding opening of the contact material stencil;
   removing the contact material stencil from the component stencil;
   removing the component stencil from the support; and
   applying the plurality of electronic components to the non-planar surface by bending the support to conform to the shape of the non-planar surface such that the contact material couples each of the plurality of electronic components to the non-planar surface of the object.

2. The method according to claim 1, further comprising using an SMT component placement system to apply the plurality of electronic components to the non-planar surface of the object.

3. The method according to claim 1,
wherein the arranging the plurality of electronic components further comprises removably fixing the plurality of electronic components on the support, and
wherein the applying the plurality of electronic components to the non-planar surface further comprises applying the plurality of electronic components to the non-planar surface while the plurality of electronic components are removably fixed on the support.

4. The method of claim 3, wherein the removably fixing the plurality of electronic components on the support further comprises providing an adhesive on the support.

5. The method according to claim 3,
wherein the support comprises at least one bend line dividing the support into a plurality of regions, each of the plurality of regions comprising at least one of the plurality of electronic components, and bending the support to conform to the shape of the non-planar surface comprises bending the support at each of the at least one bend line.

6. The method of claim 1, wherein the bending the support further comprises using at least one holding device to bend the support to conform to the shape of the non-planar surface.

7. The method of claim 1, wherein the applying the plurality of electronic components to the non-planar surface further comprises arranging the plurality of electronic components fixed on the support on the non-planar surface using at least one holding device.

8. The method according to claim 1,
wherein the applying the plurality of electronic components to the non-planar surface further comprises establishing an electrical contact between the plurality of electronic components and the non-planar surface.

9. The method according to claim 1,
further comprising removing the contact material stencil from the component stencil prior to applying the plurality of electronic components to the surface.

10. The method according to claim 9, wherein the non-planar surface comprises at least two mounting faces adjacent to each other, and the applying the plurality of electronic components to the non-planar surface further comprises arranging the plurality of electronic components along an arrangement direction of at least one of the at least two mounting surfaces.

11. A device comprising:
a flexible support comprising at least one bend line dividing the flexible support into a plurality of regions;
a component stencil on a surface of the flexible support and comprising a plurality of openings, each of the plurality of openings overlying one of the plurality of regions;
an electronic component in each of the plurality of openings in the component stencil, a top surface of the electronic component mechanically coupled to the surface of the support, and a bottom surface of the electronic component comprising at least one contact; and
a contact material stencil disposed over the component stencil and the electronic component, the contact material stencil comprising at least one opening corresponding to at least one contact of the at least one electronic component.

12. The device of claim 11, further comprising contact material in the at least one opening in the component stencil.

13. The device of claim 12, wherein the contact material is one of solder paste and conductive adhesive.

14. The device of claim 13, wherein the conductive adhesive is a UV-curable adhesive.

15. The device of claim 11, wherein the support comprises polyimides.

16. The device of claim 11, wherein the electronic component is a light-emitting diode.

17. A device comprising:
a flexible support comprising at least one bend line dividing the flexible support into a plurality of regions;
a component stencil on the support and comprising a plurality of openings, each of the plurality of openings overlying one of the plurality of regions; and
a plurality of electronic components having a top surface and a bottom surface, the bottom surface comprising at least one contact,
one of the plurality of electronic components being disposed in one of the plurality of openings with the top surface of each of the plurality of electronic components on the flexible support.

18. The device of claim 17, further comprising a contact material on the at least one contact.

19. The device of claim 18, further comprising a contact material stencil on the component stencil, the contact material stencil having a respective opening over each of the at least one contact of each of the plurality of electronic components, the contact material on the at least one contact contained within the respective opening in the contact material stencil.

20. The device of claim 17, wherein the plurality of electronic components comprises a plurality of light-emitting diodes.

* * * * *